United States Patent [19]

Adachi et al.

[11] Patent Number: 5,495,586
[45] Date of Patent: Feb. 27, 1996

[54] COMPUTER SYSTEM HAVING MEMORY CARD/DISK STORAGE UNIT USED AS EXTERNAL STORAGE DEVICE

[75] Inventors: Kensuke Adachi, Tokyo, Japan; Tomihisa Ogawa, Los Altos, Calif.; Toshimitsu Takizawa, Tokyo, Japan

[73] Assignee: Kabushiki Kaisha Toshiba, Kawasaki, Japan

[21] Appl. No.: 351,065

[22] Filed: Nov. 30, 1994

Related U.S. Application Data

[63] Continuation of Ser. No. 995,172, Dec. 24, 1992, abandoned.

[30] Foreign Application Priority Data

Dec. 26, 1991 [JP] Japan .................................. 3-345610
Dec. 26, 1991 [JP] Japan .................................. 3-345612

[51] Int. Cl.$^6$ .................................. G06F 13/00; G11B 33/02
[52] U.S. Cl. .................................. 395/280; 369/75.1; 361/685
[58] Field of Search .................................. 395/325; 361/394, 361/392, 384; 360/69, 98.02, 98.06, 99.06, 99.12; 364/708

[56] References Cited

U.S. PATENT DOCUMENTS

| | | | |
|---|---|---|---|
| 4,833,554 | 5/1989 | Dalziel et al. | 360/98.04 |
| 4,894,792 | 1/1990 | Mitchell et al. | 364/708 |
| 5,107,400 | 4/1992 | Kobayashi | 361/392 |
| 5,132,876 | 7/1992 | Ma | 361/394 |
| 5,196,991 | 5/1993 | Hsieh | 361/392 |
| 5,214,550 | 5/1993 | Chan | 360/97.01 |
| 5,233,594 | 8/1993 | Wilhelm | 369/75.1 |
| 5,253,129 | 10/1993 | Blackborow et al. | 360/69 |
| 5,299,089 | 3/1994 | Lwee | 361/684 |

*Primary Examiner*—Jack B. Harvey
*Assistant Examiner*—Ayaz R. Sheikh
*Attorney, Agent, or Firm*—Finnegan, Henderson, Farabow, Garrett & Dunner

[57] ABSTRACT

In a computer system using either a memory card or a hard-disk drive (HDD) as an external storage device, a slot formed in a computer body for insertion of the external storage device is used commonly for the memory card and HDD. The HDD has an attachment guide member such that the HDD can be detachably mounted in the computer body through the slot. The HDD has a connector having the same specification standard as an interface connector of a memory card. The HDD is connected to the computer body via the connector for transmission of interface signals.

8 Claims, 9 Drawing Sheets

| PIN NO. | SYMBOL | FUNCTION |         | PIN NO. | SYMBOL | FUNCTION | | PIN NO. | SYMBOL | FUNCTION |
|---|---|---|---|---|---|---|---|---|---|---|
| 1 | GND | GROUND | | 19 | A16<br>A15<br>A12<br>A7<br>A6<br>\|<br>A0 | ADDRESS<br>BUS | | 46 | A17 | ADDRESS<br>BUS |
| 2<br>\|<br>6 | D3<br>\|<br>D7 | DATA<br>BUS | | —<br>29 | | | | —<br>50 | —<br>A21 | |
| 7 | $\overline{CE1}$ | CARD<br>ENABLE | | 30<br>\|<br>32 | D0<br>\|<br>D2 | DATA<br>BUS | | 51 | Vcc | POWER |
| 8 | A10 | ADDRESS<br>BUS | | 33 | WP | WRITE<br>PROTECTION | | 53 | A22 | ADDRESS<br>BUS |
| 9 | $\overline{OE}$ | OUTPUT<br>ENABLE | | 36 | $\overline{CD1}$ | CARD<br>DETECTING | | —<br>56 | —<br>A25 | |
| 10<br>\|<br>14 | A11<br>A9<br>A8<br>A13<br>A14 | ADDRESS<br>BUS | | 37<br>\|<br>41 | D11<br>\|<br>D15 | DATA<br>BUS | | 61 | $\overline{REG}$ | ↓ (ATTRIBUTE MEMORY SELECTING) |
| 15 | $\overline{WE}$/PGM | WRITE<br>ENABLE | | 42 | $\overline{CE2}$ | CARD<br>ENABLE | | 62 | BVD2 | POWER<br>VOLTAGE<br>DETECTING |
| 17 | Vcc | POWER | | | | | | 63 | BVD1 | |
| | | | | | | | | 64<br>—<br>66 | D8<br>—<br>D10 | DATA<br>BUS |
| | | | | | | | | 67 | $\overline{CD2}$ | CARD<br>DETECTING |
| | | | | | | | | 68 | GND | GROUND |

FIG. 10B

COMPUTER SYSTEM HAVING MEMORY CARD/DISK STORAGE UNIT USED AS EXTERNAL STORAGE DEVICE This application is a continuation of application Ser. No. 07/995,172, filed Dec. 24, 1992, now abandoned.

BACKGROUND OF THE INVENTION

1. Field of the Invention

The present invention relates to a computer system having a memory card or a small-sized hard-disk drive as an external storage device.

2. Description of the Related Art

A conventional computer system, e.g. a portable computer, employs, as an external storage device, a small-sized hard-disk drive (HDD) including, e.g. a 2.5-inch disk. Compared to a floppy-disk drive (FDD), HDD has advantages, i.e. a larger capacity and a higher access speed.

However, the disk used in HDD cannot be replaced, whereas a floppy disk used in FDD as memory medium can easily be replaced. Although HDD can be replaced as a whole unit, users cannot easily replace it.

On the other hand, systems using a memory card as external storage device, other than HDD and FDD, have been developed. The memory card is a memory device wherein a thin card-like casing contains a circuit board on which memory ICs are mounted.

Like the disk in FDD, the memory card is easily replaceable. In addition, the memory card has a higher access speed than HDD. At present, however, the memory capacity of the memory card is smaller than that of HDD or FDD.

There have already been specification standards for memory cards, based on JEIDA (Japan Electronic Industry Development Association) and PCMCIA (U.S.A.) (Personal Computer Memory Card International Association). The specification standards based on JEIDA and PCMCIA are partially common.

There is an idea that both a replaceable memory card with high access speed and HDD with large memory capacity are commonly used in a system. In such a case, however, the size of the system increases and the manufacturing cost of the system also increases.

It is ideal, therefore, to use the memory card or HDD selectively as external storage device, depending on the need. In order to achieve this, it is necessary to solve technical problems, thereby realizing easy replacement of HDD and easy mutual exchange of the memory card and HDD.

SUMMARY OF THE INVENTION

The object of the present invention is to provide a computer system in which one of a memory card and a disk storage unit (e.g. HDD) can easily be mounted.

In order to achieve the object, there is provided a computer system comprising:

memory card means used as an external storage device of the computer system and having a standardized shape and interface connector means for connection with a central processing unit of the computer system;

disk storage means used as an external storage device of the computer system and including a storage unit having a storage medium and read/write means for performing data read/write operations on the storage medium, the storage unit having on an external side portion thereof an attachment guide member and first connector means for connection with the central processing unit of the computer system; and a computer main body including the central processing unit, a slot through which one of the memory card means and the disk storage means is selectively inserted, a holder commonly used to hold one of the attachment guide member of the storage unit and the memory card means inserted through the slot, and second connector means, detachably coupled to one of the first connector means of the storage unit held by the holder and the interface connector means of the memory card means, for effecting transmission of interface signals between the central processing unit and one of the disk storage means and the memory card means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A first embodiment of the present invention will now be described with reference to the accompanying drawings.

Figure 1:
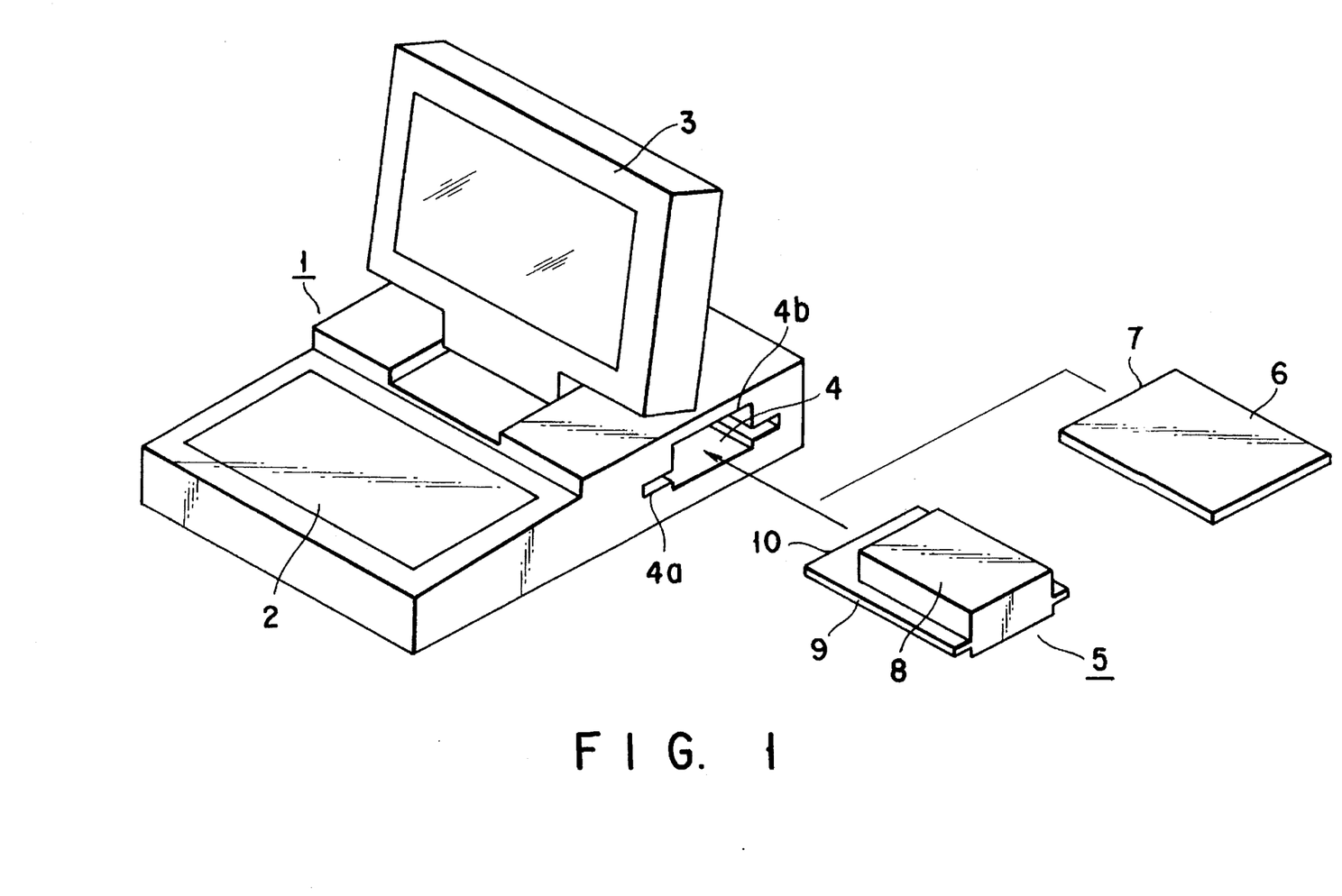
FIG. 1 is a perspective view showing the structure of a computer system according to a first embodiment of the present invention.

A computer system according this invention is, for example, a lap-top small-sized computer, as shown in FIG. 1. A computer body 1 comprises a keyboard 2 and a display unit 3 as one body. A CPU (Central Processing Unit), a RAM, a ROM, etc. (not shown) are mounted on a circuit board in the computer body 1.

The computer body 1 has a slot 4 in which an external storage device according to the present invention is detachably mounted. For example, either a small-sized HDD (hard-disk drive) 5 or a memory card 6 can be employed as external storage device to be mounted in the slot 4. The memory card 6 is, e.g. a standard IC (Integrated Circuit) card produced based on JEIDA or PCMCIA. A standardized interface connector 7 is provided on one side surface of the memory card 6.

HDD 5 comprises a disk drive unit 8 including a hard disk controller (HDC), and also comprises an attachment guide member 9 provided on a side portion of the drive unit 8, and a connector 10 formed integral with the guide member 9. The attachment guide member 9 is a plate-like metallic member and it has substantially the same width as that of the memory card 6.

Either HDD 5 or memory card 6 can be detachably mounted in the slot 4. Specifically, as shown in FIG. 1, the slot 4 has a shape obtained by compounding a lateral slit 4a corresponding to the width of the memory card 6 and a hole 4b corresponding to the height and width of HDD 5.

Figure 2:
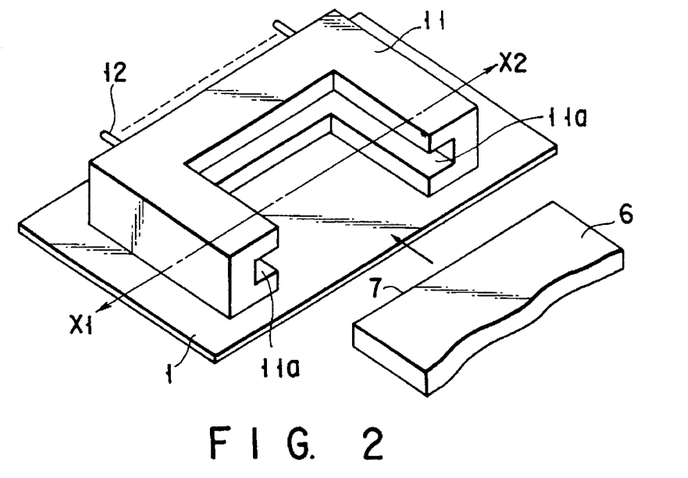
FIG. 2 is a perspective view showing the structure of a holder according to the first embodiment.

As is shown in FIG. 2, the computer body 1 is provided with a holder 11 for holding the memory card 6 inserted from the slot 4. The holder 11 has a groove 11a for holding the memory card 6. In addition, the holder 11 is integrally provided with an interface connector 12 to be mated with the interface connector of the memory card 6. The interface connector 12 is connected to the CPU in the computer body 1 via a bus, signal lines, etc. When the memory card 6 is inserted from the slot 4 and mounted in the holder 11, the interface connector 7 is coupled to the interface connector 12, thereby enabling interface signals to be transmitted between the memory card 6 and the CPU.

The holder 11 can hold either the memory card 6 or HDD 5. When HDD 5 is inserted from the slot 4, as shown in FIG. 1, the attachment guide member 9 is held in the groove 11a of the holder 11. Thereby, the unit 8 of HDD 5 is held by the holder 11 and mounted within the computer body 1. When HDD 5 is mounted in the holder 11, the connector 10 of HDD 5 is coupled to the interface connector 12, thus enabling interface signals to be transmitted between HDD 5 and CPU.

Figure 3A:
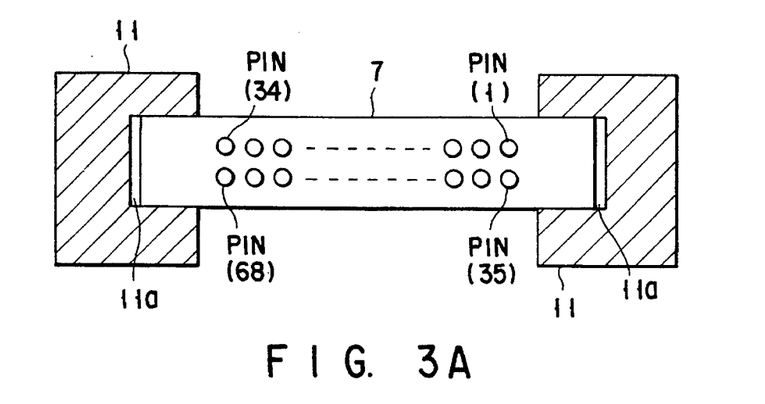
FIG. 3A and FIG. 3B are cross-sectional views of the holder shown in FIG. 2.
Figure 3B:
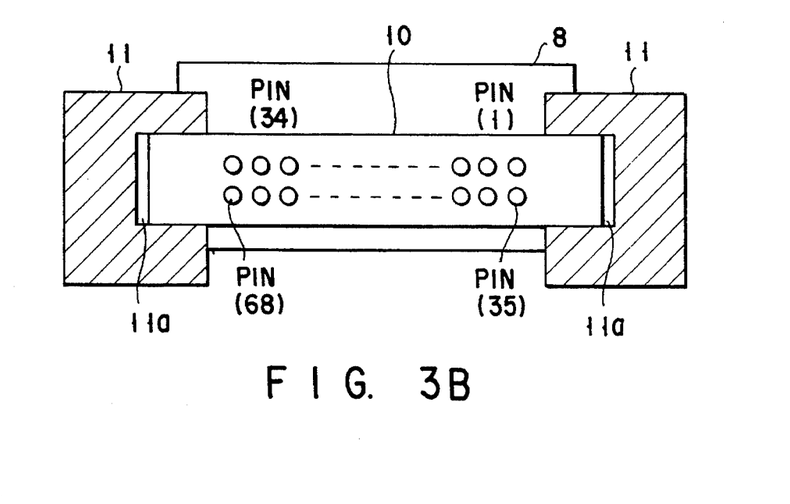

The interface connector 7 of the memory card 6 has a 68-pin arrangement based on JEIDA standard (version 4 based on PCMCIA), as shown in FIG. 3A. Like the interface connector 7, the connector 10 of HDD 5 has a 68-pin arrangement based on JEIDA, as shown in FIG. 3B. FIGS. 3A and 3B are cross-sectional views taken along line X1–X2 in FIG. 2.

Figure 4:
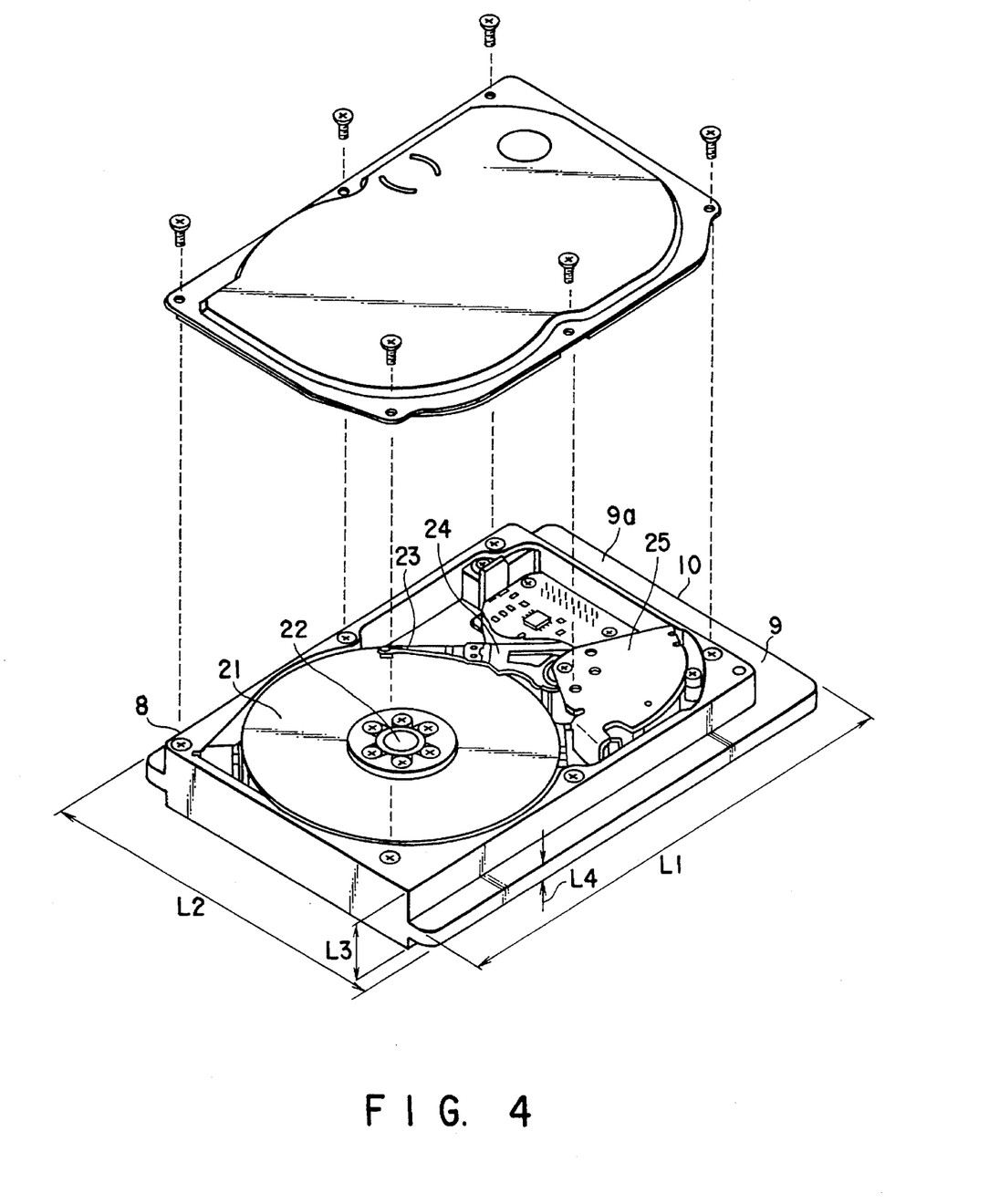
FIG. 4 is an exploded perspective view showing the structure of HDD according to the first embodiment.

The disk drive unit 8 of HDD 5 comprises, as shown in FIG. 4, a disk 21, spindle motor 22, head 23, carriage 24 and carriage driving motor 25, which constitute a disk drive. The attachment guide 9 is provided on the external side face of the unit 8 integrally or independently.

In accordance with the standard specifications of the memory card 6, the outside dimensions of HDD 5 are determined, for example, as follows: the longitudinal length L1 of the attachment guide member 9 is 85.6 mm±0.2 mm, the transverse length L2 is 54.0 mm±0.1 mm, the thickness L3 of the unit 8 is about 10 mm, and the thickness L4 of the guide member 9 is 3.3 mm. In the first embodiment, the dimensions L1, L2 and L4 of the guide member 9 are substantially equal to the corresponding outside dimensions of the standardized memory card 6.

Figure 5A:
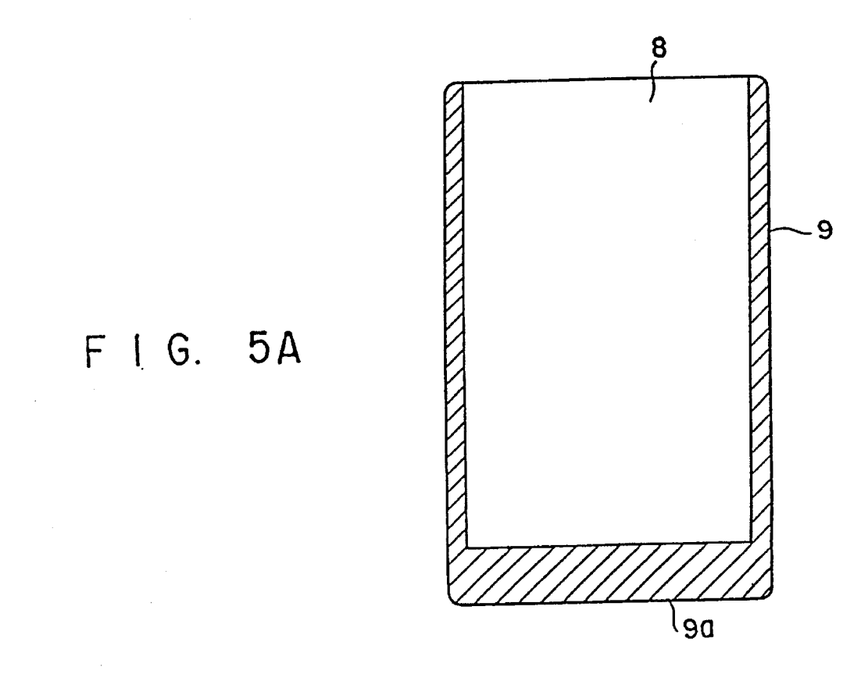
FIG. 5A, FIG. 5B and FIG. 5C are a plan view, a front view and a side view of HDD according to the first embodiment.
Figure 5B:
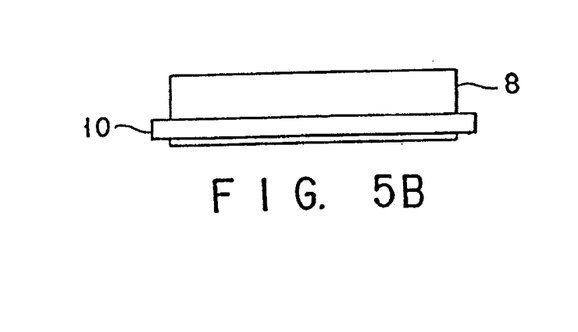
Figure 5C:
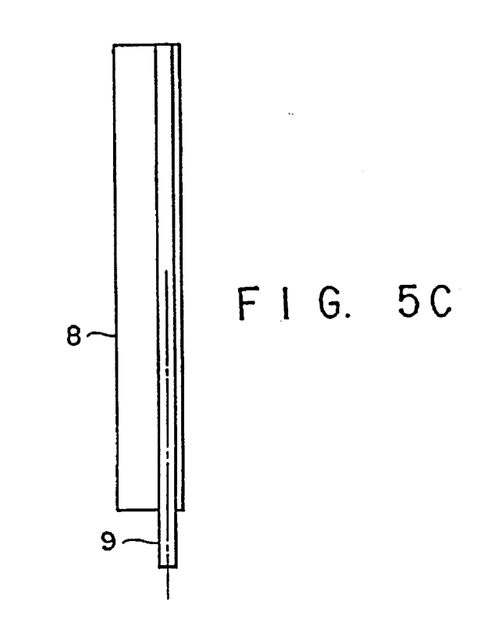

FIG. 5A is a plan view showing the shape of the attachment guide member 9 of HDD 5. The connector 10 is integrally formed on one side face of the guide member 9, as shown in FIG. 5B. FIG. 5C is a side view of HDD 5.

Figure 6:
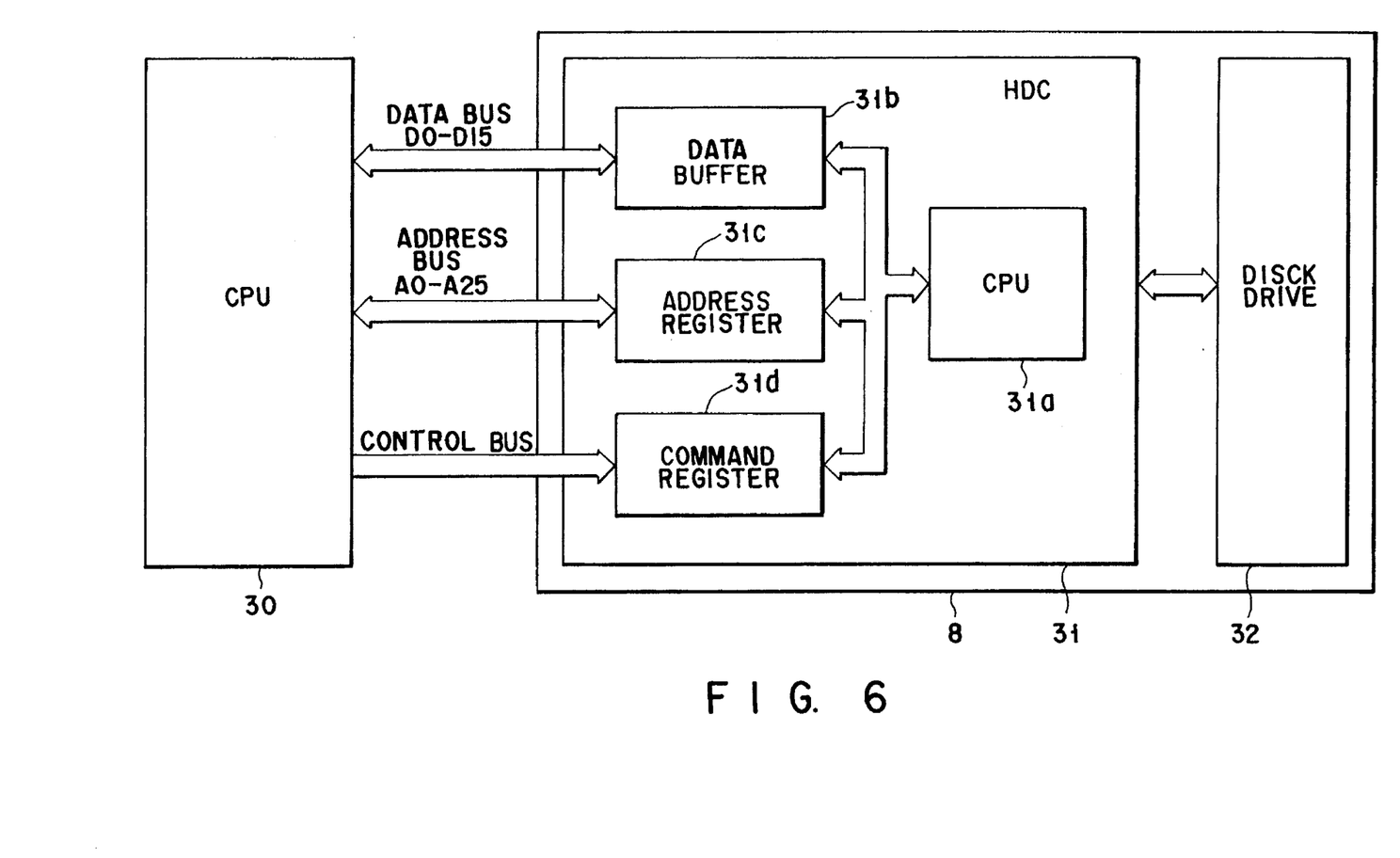
FIG. 6 is a block diagram for explaining the structure of the interface of HDD according to the first embodiment.

When HDD 5 is inserted from the slot 4 and mounted in the holder 11 of the computer body 1, the HDD 5 is connected to a CPU 30 in the computer body 1, as shown in FIG. 6. Specifically, the connector 12 of the computer body 1 is coupled to the connector 10 of HDD 5, and thereby HDC 31 is connected to CPU 30 by means of a data bus (D0–D15), an address bus (A0–A25) and a control bus. HDC 31 is a controller for HDD 5 and constitutes an interface between a disk drive 32 and CPU 30 (i.e. host system).

HDC 31 comprises a CPU 31a, a data buffer 31b, an address register 31c and a command register 31d. The data buffer 31b is connected to the data bus (D0–D15). The data buffer 31b is a buffer memory for temporarily storing data transferred from CPU 30 and data read out from the disk drive 32. The address register 31c is connected to the address bus (A0–A25) and stores addresses transferred from CPU 30. The command register 31d is connected to the control bus and stores control data, e.g. a read/write command transferred from CPU 30.

Figure 8:
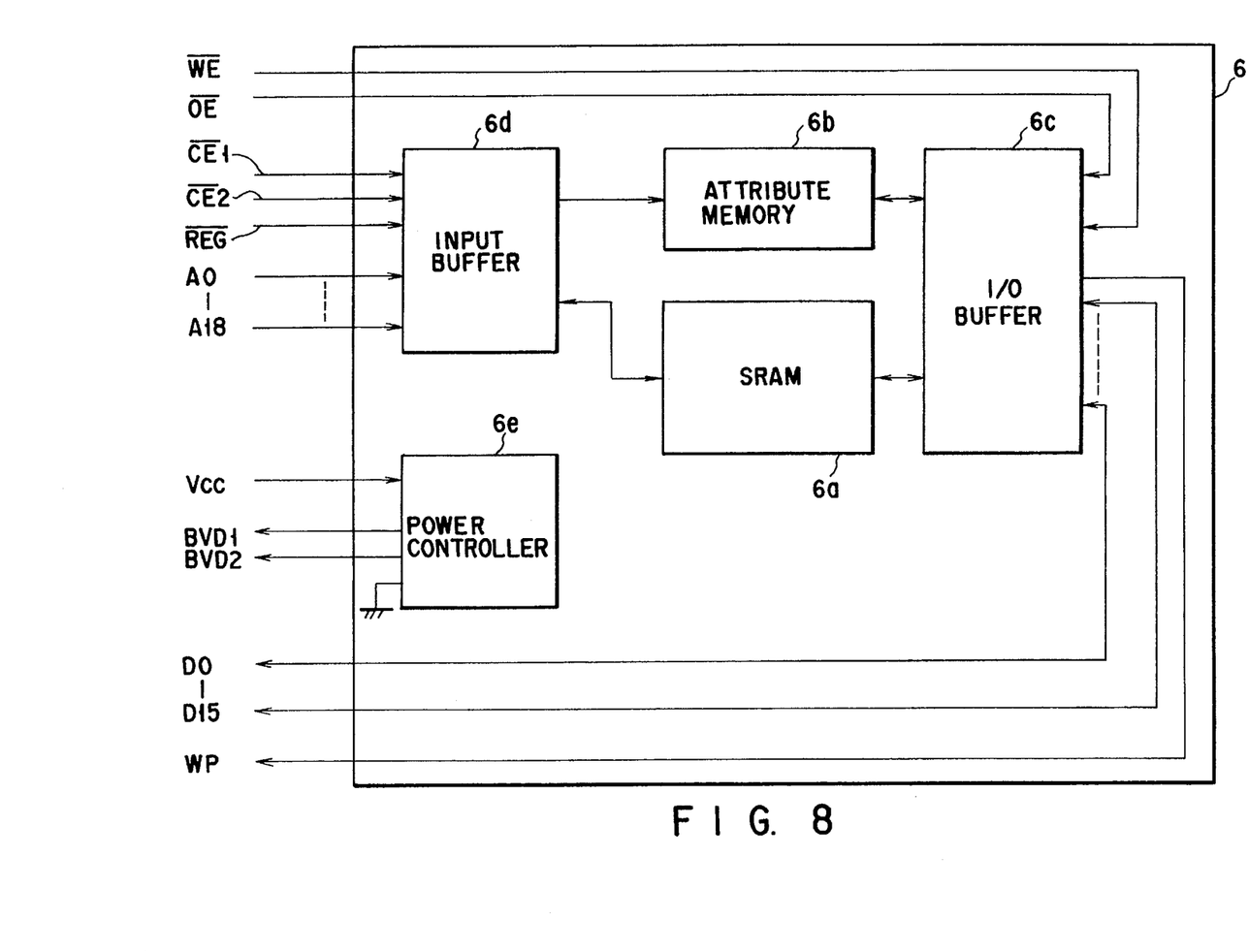
FIG. 8 is a block diagram for explaining the structure of the memory card according to the first embodiment.

FIG. 8 shows an example of the memory card 6. A SRAM (Static Random Access Memory) 6a is mounted as memory device. The memory card 6 comprises an attribute memory 6b, an I/O buffer 6c, an input buffer 6d, and a power controller 6e. The attribute memory 6b stores card attribute data such as data on types of memory devices mounted on the card 6, data on access speed, etc.

When the memory card 6 is inserted from the slot 4 and mounted in the holder 11 of the computer body 1, the interface connector 7 is coupled to the connector 12 of the computer body 1. Thereby, interface signals based on JEIDA standard (version 4 based on PCMCIA) are transmitted between the computer body 1 and memory card 6, as shown in FIG. 8.

Figure 7:
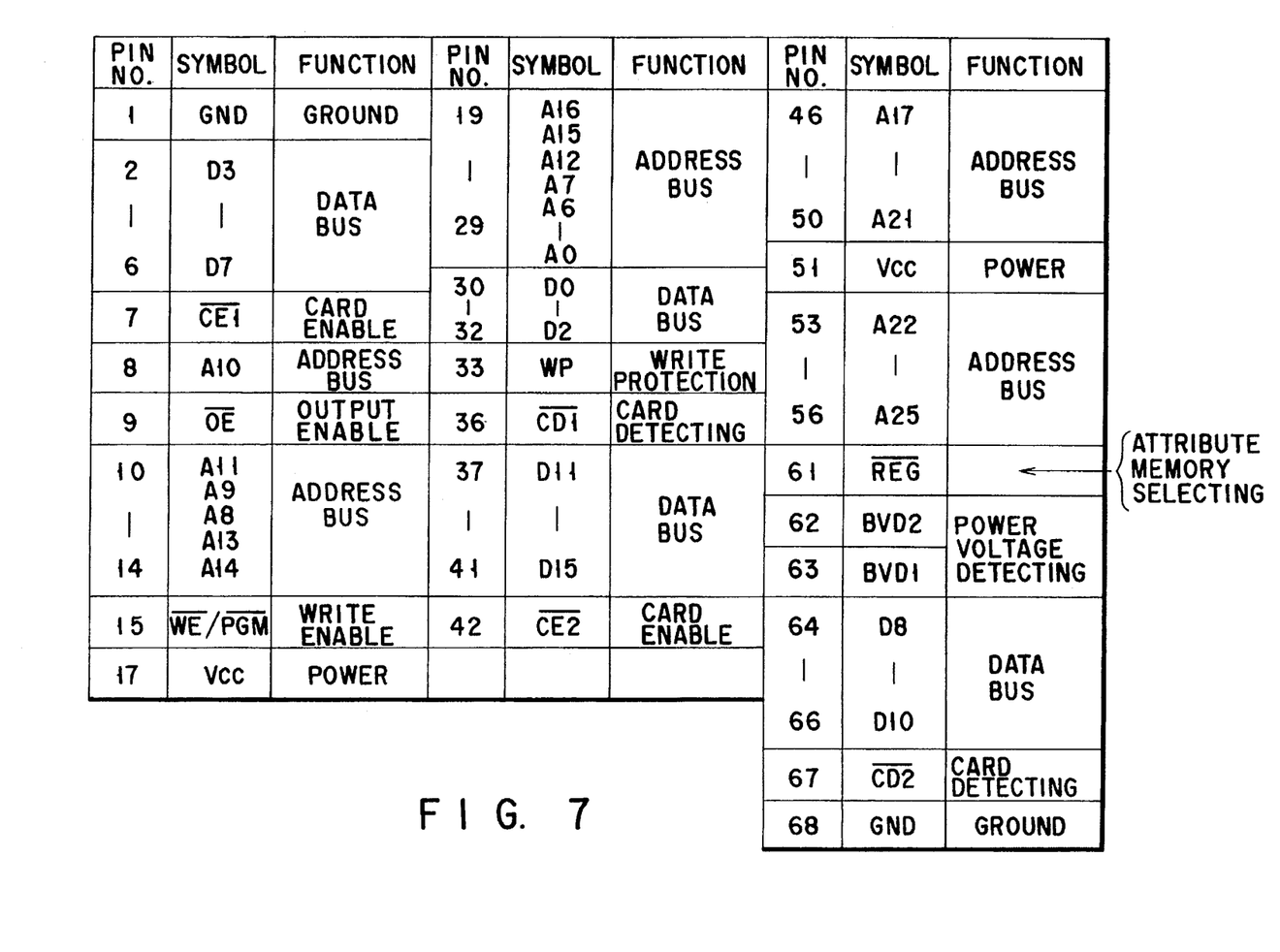
FIG. 7 is a view for explaining the pin arrangement of a standard connector used for a memory card according to the first embodiment.

FIG. 7 shows the correspondency between the pin arrangement (68 pins) of the interface connectors 7 and 12 and interface signals, which is based on JEIDA standard. For example, the data bus (D0–D15) shown in FIG. 8 is constituted by pins Nos. 2–6, 30–32, 37–41 and 64–66, as shown in FIG. 7.

As has been described above, the connector 10 of HDD 5 has the same 68-pin arrangement as the interface connector 7 of memory card 6. Accordingly, regarding the interface buses shown in FIG. 6, the data bus (D0–D15) is constituted by pins Nos. 2–6, 30–32, 37–41 and 64–66 of the connectors 10 and 12. The address bus (A0–A25) is constituted by pins Nos. 8, 10–14, 19–29, 46–50 and 53–56 of the connectors 10 and 12. Further, the control bus is constituted by pins Nos. 7, 9, 15, 42, etc. of the connectors 10 and 12 (see FIG. 7).

When HDD 5 is mounted in the computer body 1, control signals corresponding to card enable signals become active through pins Nos. 7 and 42, thereby executing data read/write operations. In the write operation, a write enable signal (write command) becomes active through pin No. 15, and an address transferred from CPU 30 in the computer body 1 is stored in the address register 31c of HDC 31. Further, write data transferred from CPU 30 is stored in the data buffer 31b of HDC 31. By this address and write data, CPU 31a in HDC 31 enables the disk drive 32 to perform the write operation. In the read operation, a read enable signal (read command) becomes active through pin No. 9, and an address transferred from CPU 30 in the computer body 1 is stored in the address register 31c in HDC 31. CPU 31a in HDC 31 enables the disk drive 32 to perform the read operation, and stores the read data of the designated address in the data buffer 31b. Then, the read data is transferred to CPU 30 in the computer body 1 through the data bus (D0–D15).

As has been described above, HDD 5 is provided with the connector 10 having the same standardized pin arrangement as the interface connector 7 of the memory card 6. Thereby, the interface connector 12 provided in the computer body 1 for connection with the external storage device can be used for both HDD 5 and memory card 6. Further, since the slot 4 has the shape matching with HDD 5 and memory card 6, as shown in FIG. 1, the HDD 5 and memory card 6 used as external storage device can be mounted at the same position.

Therefore, according to the present invention, in the computer system using either memory card 6 or HDD 5 as external storage device, the memory card 6 or HDD 5 can be selectively used on an as-needed basis. In addition, compared to the conventional system wherein memory card 6 and HDD 5 are mounted at different locations, the size of the computer body 1 can be reduced.

Furthermore, since HDD 5 has a special structure wherein the HDD 5 is provided with the attachment guide member 9, HDD 5 can easily be mounted in and detached from the computer body 1. Thus, the replacement procedure for replacement between HDD 5 and memory card 6 can be simplified.

Figure 9:
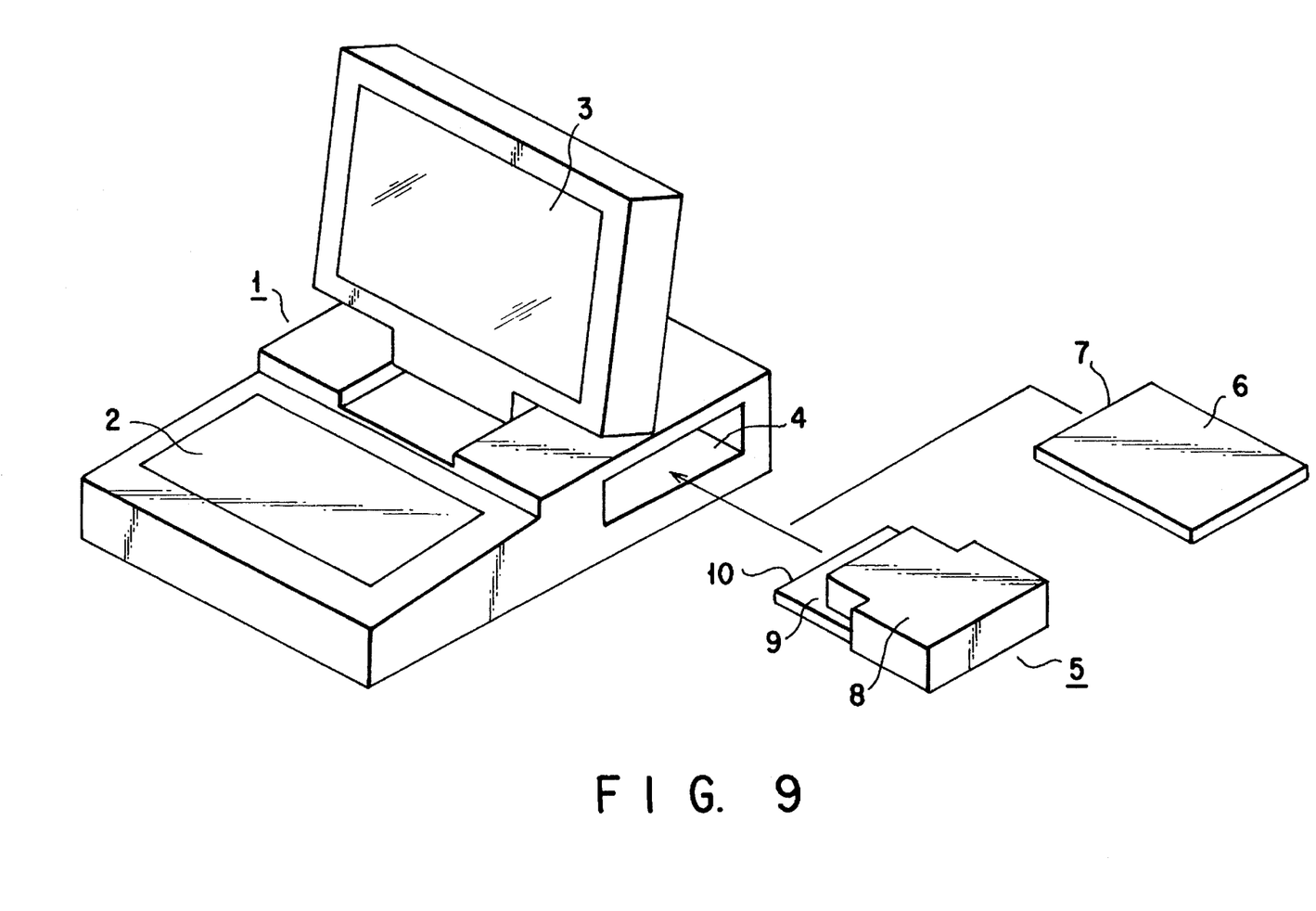
FIG. 9 is a perspective view showing the structure of a computer system according to a second embodiment of the invention.
Figure 10A:
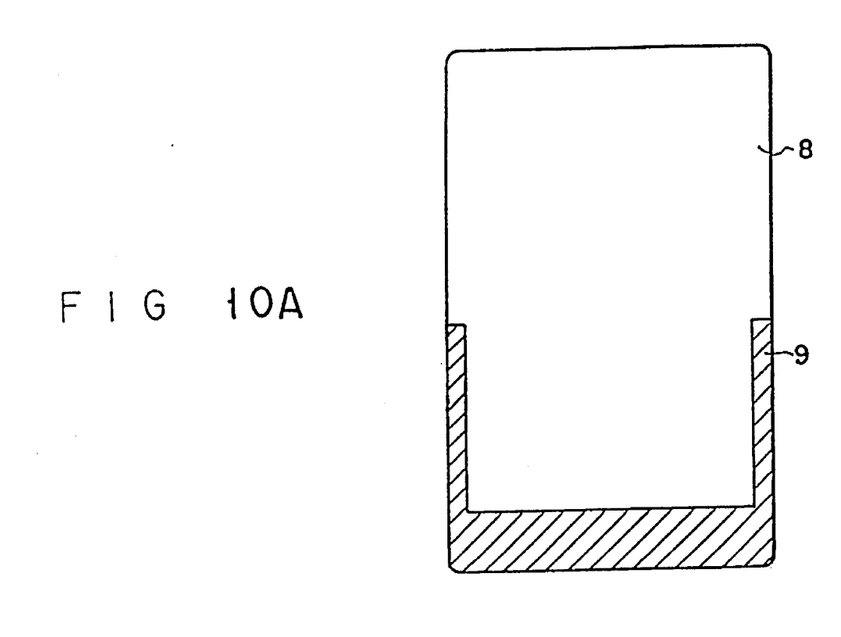
FIG. 10A, FIG. 10B and 10C are a plan view, a front view and a side view of HDD according to the second embodiment.
Figure 10B:
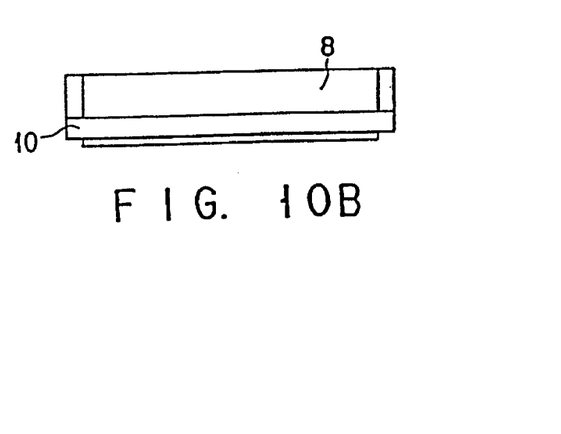
Figure 10C:
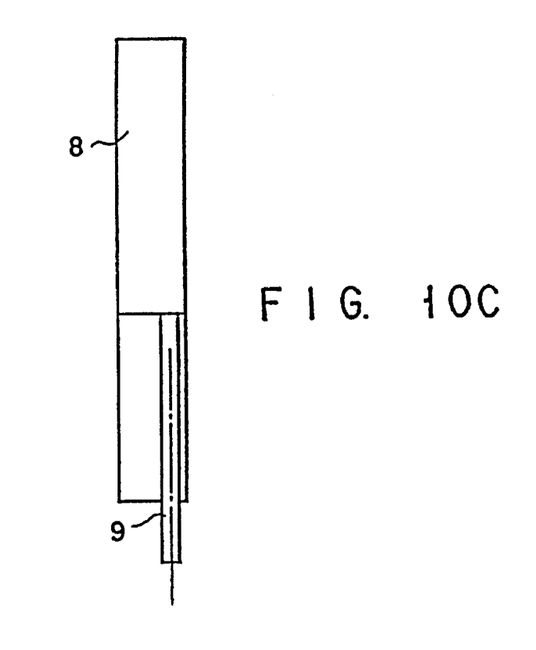

FIG. 9 is a perspective view showing a computer system according to a second embodiment of the invention. In the second embodiment, the disk drive unit 8 and attachment guide member 9 of HDD 5 are modified. Specifically, the width (L2) of the unit 8 is equal to that of the attachment guide member 9 (corresponding to the width of the memory card 6). More specifically, as shown in FIG. 10A, the longitudinal length L5 of the guide member 9 is reduced to, e.g. about 40 mm, and the width of the rear part of the unit 8 (opposite to the connector 10) is increased (see FIG. 5A). FIG. 10B is a front view and FIG. 10C is a side view.

In the second embodiment, as compared to the first embodiment, the slot 4 can be made to have a rectangular shape matching with the height and width of the unit 8 of HDd 5. In other words, the lateral slit 4a shown in FIG. 1 can be omitted. Accordingly, unlike the slot 4 having a special shape shown in FIG. 1, the slot 4 having a simple rectangular shape can easily be formed in the computer body 1. In addition, since the size of the unit 8 can be slightly increased, the number of parts mounted in the unit 8 can be increased. The structures of the computer body 1 and connector 10 in the second embodiment are identical to those in the first embodiment.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A computer system having a computer main body which includes a central processing unit and a slot for arrangement of an external storage device, the computer system comprising:

disk storage means for storing external data, the storage means comprising the external storage device, the disk storage means including a disk storage unit, first connector means for connecting the disk storage unit to the central processing unit, and an attachment guide member, the disk storage unit enclosing a disk as storage medium and read/write means for performing data read/write operations on the disk, the first connector means being coupled to the disk storage unit, the attachment guide member protruding from an external side portion of the disk storage unit;

memory card means for storing external data, the card means comprising the external storage device, wherein the memory card means has a card-like casing, a memory device in an inner portion of the casing, and interface connector means for connecting the memory card means to the central processing unit;

holder means in an inner portion of the computer main body, and commonly used for holding one of the attachment guide member and the casing of the memory card means, the holder means detachably holding the attachment guide member when the disk storage means is inserted in the computer main body through the slot, and the holder means detachably holding the casing when the memory card means is inserted in the computer main body through the slot, the holder means having a receiving portion for selectively engaging the attachment guide member when the disk storage means is inserted in the computer main body through the slot, said receiving portion selectively engaging the casing when the memory card means is inserted in the computer main body through the slot; and second connector means on the holder means, said second connector means being detachably coupled to the first connector means when the disk storage means is inserted in the computer main body through the slot, for transmitting interface signals between the central processing unit and the disk storage unit, said second connector means being detachably coupled to the interface connector means, at the same position as where the second connector means couples to the disk storage means, when the memory card means is inserted in the computer main body through the slot, for transmitting interface signals between the central processing unit and the memory device.

2. The system according to claim 1, wherein the disk storage unit of the disk storage means has a box-like shape, the first connector means is provided on one face of the external side portion of the disk storage unit, the attachment guide member is continuous with the first connector means and is provided on parallel two faces of the external side portion of the disk storage unit, and the width of the disk storage unit including the attachment guide member is substantially equal to the width of the memory card means.

3. The system according to claim 2, wherein the receiving portion is a groove for holding one of the attachment guide member, provided on the parallel two faces of the external side portion of the disk storage unit, and each of parallel side portions of the memory card means, and the holder means is integral with the second connector means.

4. The system according to claim 1, wherein the slot of the computer main body has a shape obtained by compounding a lateral slit corresponding to the width and thickness of the memory card inserted into the computer main body and a hole corresponding to the height and width of the disk storage unit inserted into the computer main body.

5. The system according to claim 1, wherein the holder means of the computer main body is integral with the second connector means and constructed such that one of the first connector means and the interface connector means is coupled to the second connector means in the state in which the holder means holds one of the attachment guide member of the disk storage unit inserted through the slot and the memory card means.

6. The system according to claim 1, wherein the second connector means of the computer main body has a structure corresponding to the interface connector means having a standardized structure, the first connector means of the disk storage means, when connected to the second connector means, effects transmission of interface signals necessary for the operation of the disk storage unit, and the first connector means has a pin arrangement common to the pin arrangement of the interface connector means.

7. A computer system having a computer main body which includes a central processing unit and a slot for arrangement of an external storage device, the computer system comprising:

a disk storage unit used as the external storage device of the computer system, the disk storage unit enclosing a disk used as a storage medium and read/write means for performing data read/write operations on the disk;

an attachment guide member protruding from an external side portion of the disk storage unit;

a first connector on the attachment guide member and coupled to the disk storage unit for connection with the central processing unit;

a memory card used as the external storage device of the computer system, the memory card including a card-like casing, a memory device inside the casing, and an interface connector on the casing for connection with the central processing unit;

a holder inside the computer main body and commonly used to hold one of the attachment guide member and the casing, wherein the holder has a receiving portion therein for selectively engaging the attachment guide member when the disk storage unit is inserted in the computer main body through the slot and for selectively engaging the casing when the memory card is inserted in the computer main body through the slot; and a second connector on the holder, wherein the second connector detachably couples to the first connector when the disk storage unit is inserted in the computer main body through the slot for transmitting interface signals between the central processing unit and the disk storage unit, and wherein the second connector detachably couples to the interface connector, at the same position as where the second connector couples to the first connector, when the memory card is inserted in the computer main body through the slot for transmitting interface signals between the central processing unit and the memory device.

8. The computer system according to claim 7, wherein the receiving portion is a groove.

\* \* \* \* \*